(12) United States Patent
Shi et al.

(10) Patent No.: US 12,464,902 B2
(45) Date of Patent: Nov. 4, 2025

(54) DISPLAY PANEL AND ELECTRONIC DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Bo Shi, Beijing (CN); Weiyun Huang, Beijing (CN); Chi Yu, Beijing (CN); Yao Huang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 465 days.

(21) Appl. No.: 17/921,395

(22) PCT Filed: Jun. 8, 2021

(86) PCT No.: PCT/CN2021/098961
§ 371 (c)(1),
(2) Date: Oct. 26, 2022

(87) PCT Pub. No.: WO2022/022079
PCT Pub. Date: Feb. 3, 2022

(65) Prior Publication Data
US 2023/0200140 A1 Jun. 22, 2023

(30) Foreign Application Priority Data
Jul. 31, 2020 (CN) .......................... 202010761391.4

(51) Int. Cl.
*H10K 59/122* (2023.01)
*H10K 59/131* (2023.01)
(Continued)

(52) U.S. Cl.
CPC ......... *H10K 59/122* (2023.02); *H10K 59/131* (2023.02); *H10K 59/353* (2023.02); *H10K 59/65* (2023.02)

(58) Field of Classification Search
CPC ........................... H10K 59/122; H10K 59/131
See application file for complete search history.

(56) References Cited

U.S. PATENT DOCUMENTS

2020/0105843 A1* 4/2020 Baek ..................... H10K 50/813
2020/0127061 A1* 4/2020 Zou ...................... H10K 59/121

FOREIGN PATENT DOCUMENTS

CN 110264894 A 9/2019
CN 110581160 A 12/2019
(Continued)

*Primary Examiner* — Douglas M Menz
(74) *Attorney, Agent, or Firm* — HOUTTEMAN LAW LLC

(57) ABSTRACT

A display panel (10), including a first display region (11) and a second display region (12); pixel density of the first display region (11) is the same as that of the second display region (12); the first display region (11) includes a first pixel unit (112), which includes a first pixel defining layer (1121) and a first pixel anode (1122) corresponding to the first pixel defining layer (1121); the second display region (12) includes a second pixel unit (122), which includes a second pixel defining layer (1221) and a second pixel anode (1222) corresponding to the second pixel defining layer (1221); opening area of the first pixel defining layer (1121) is smaller than that of the second pixel defining layer (1221); and exposed area of the first pixel anode (1122) is smaller than that of the second pixel anode (1122). The present application also discloses an electronic device.

18 Claims, 4 Drawing Sheets

(51) Int. Cl.
*H10K 59/35* (2023.01)
*H10K 59/65* (2023.01)

(56) References Cited

FOREIGN PATENT DOCUMENTS

| | | |
|---|---|---|
| CN | 110599957 A | 12/2019 |
| CN | 111370441 A | 7/2020 |
| CN | 111739924 A | 10/2020 |
| CN | 212412056 U | 1/2021 |

* cited by examiner

DISPLAY PANEL AND ELECTRONIC DEVICE

PRIORITY INFORMATION

This is a National Phase Application filed under 35 U.S.C. 371 as a national stage of PCT/CN2021/098961, filed on Jun. 8, 2021, an application claiming the priority and benefit of the Chinese Patent Application No. 202010761391.4 filed to the CNIPA on Jul. 31, 2020, the content of which is incorporated herein by reference in its entirety.

TECHNICAL FIELD

The present disclosure relates to the display field, in particular to a display panel and an electronic device.

BACKGROUND

At present, in the camera-under-screen technology, a camera module is located under a screen, and the external light needs to pass through the screen to reach the camera module. Wires are regularly arranged on the screen and pixel units are periodically arranged on the screen, so that a diffraction phenomenon occurs when light passes through the screen, and thus, the imaging quality of the camera module is poor.

In the related art, a resolution of a screen region corresponding to the camera module may be reduced, to increase a transmittance of the screen, which alleviates the diffraction phenomenon generated when light passes through the screen from outside, and improves the shooing quality. However, the reduction of the resolution of the screen region corresponding to the camera module affects the visual experience of the user.

SUMMARY

In view of the above, the present disclosure provides a display panel and an electronic device.

A display panel of the embodiment of the present disclosure includes a first display region and a second display region, wherein a pixel density of the first display region is the same as a pixel density of the second display region; the first display region includes a first pixel unit, which includes a first pixel defining layer and a first pixel anode corresponding to the first pixel defining layer; the second display region includes a second pixel unit, which includes a second pixel defining layer and a second pixel anode corresponding to the second pixel defining layer; wherein an opening area of the first pixel defining layer is smaller than that of the second pixel defining layer; and an exposed area of the first pixel anode is smaller than that of the second pixel anode.

In some embodiments, the opening area of the first pixel defining layer is ½ of that of the second pixel defining layer; and the exposed area of the first pixel anode is ½ of that of the second pixel anode.

In some embodiments, the first display region includes a plurality of first pixel units, and the plurality of first pixel units are arranged in an array; the second display region comprises a plurality of second pixel units, and the plurality of second pixel units are arranged in an array; and a distance between any two adjacent first pixel units is greater than a distance between any two adjacent second pixel units.

In some embodiments, each of the first pixel unit and the second pixel unit includes at least one first sub-pixel, at least one second sub-pixel, and at least one third sub-pixel; the at least one first sub-pixel, the at least one second sub-pixel, and the at least one third sub-pixel of the first pixel unit are arranged at intervals; and the at least one first sub-pixel, the at least one second sub-pixel, and the at least one third sub-pixel of the second pixel unit are arranged at intervals.

In some embodiments, each of the first sub-pixel, the second sub-pixel, and the third sub-pixel of the first pixel unit includes one first pixel anode and one first pixel defining layer, and wherein each of the first sub-pixel, the second sub-pixel, and the third sub-pixel of the second pixel unit includes one second pixel anode and one second pixel defining layer; an exposed area of the first pixel anode corresponding to the first sub-pixel in the first pixel unit is smaller than that of the second pixel anode corresponding to the first sub-pixel in the second pixel unit, and an opening area of the first pixel defining layer corresponding to the first sub-pixel in the first pixel unit is smaller than that of the second pixel defining layer corresponding to the first sub-pixel in the second pixel unit; an exposed area of the first pixel anode corresponding to the second sub-pixel in the first pixel unit is smaller than that of the second pixel anode corresponding to the second sub-pixel in the second pixel unit, and an opening area of the first pixel defining layer corresponding to the second sub-pixel in the first pixel unit is smaller than that of the second pixel defining layer corresponding to the second sub-pixel in the second pixel unit; and an exposed area of the first pixel anode corresponding to the third sub-pixel in the first pixel unit is smaller than that of the second pixel anode corresponding to the third sub-pixel in the second pixel unit, and an opening area of the first pixel defining layer corresponding to the third sub-pixel in the first pixel unit is smaller than that of the second pixel defining layer corresponding to the third sub-pixel in the second pixel unit.

In some embodiments, the first sub-pixel includes a red sub-pixel, the second sub-pixel includes a green sub-pixel, and the third sub-pixel includes a blue sub-pixel.

In some embodiments, the first pixel anode is circular.

In some embodiments, the first pixel anode is oval; and wherein an orientation of a major axis of the first pixel anode of each of the first sub-pixel and the third sub-pixel in the first pixel unit intersects an orientation of a major axis of the first pixel anode of the second sub-pixel.

In some embodiments, the first pixel anode is circular or oval; and wherein the first pixel anode of each of the first sub-pixel and the third sub-pixel in the first pixel unit is oval, and the first pixel anode of the second sub-pixel in the first pixel unit is circular.

In some embodiments, the display panel further includes transparent conductive wires in the first display region.

The present disclosure further provides an electronic device, including the display panel according to any one of the above embodiments.

In some embodiments, the electronic device further includes a sensor directly opposite to the first display region of the display panel.

In the display panel and the electronic device of the present disclosure, the opening area of the first pixel defining layer of the first pixel unit is smaller than the opening area of the second pixel defining layer of the second pixel unit, and the exposed area of the first pixel anode of the first pixel unit is smaller than the exposed area of the second pixel anode of the second pixel unit, so that in a case where the pixel density of the first display region is the same as the pixel density of the second display region, the light transmittance of the first display region is greater than that of the second display region. In this way, the diffraction phenomenon occurring when light passes through the first display region from the outside can be alleviated, and the imaging effect of a camera module disposed under the first display region can be improved. Besides, the problem can be avoided that the reduction of the resolution of the first display region corresponding to the camera module affects the visual experience of the user.

Additional aspects and advantages of the present disclosure will be set forth in part in the following description, will become apparent in part from the following description, or may be learned by practice of the present disclosure.

BRIEF DESCRIPTION OF DRAWINGS

The above and/or additional aspects and advantages of the present disclosure will become apparent and readily appreciated from the following description of the embodiments, taken in conjunction with the accompanying drawings, in which.

DESCRIPTION OF REFERENCE CHARACTERS OF MAIN ELEMENTS

Figure 1:
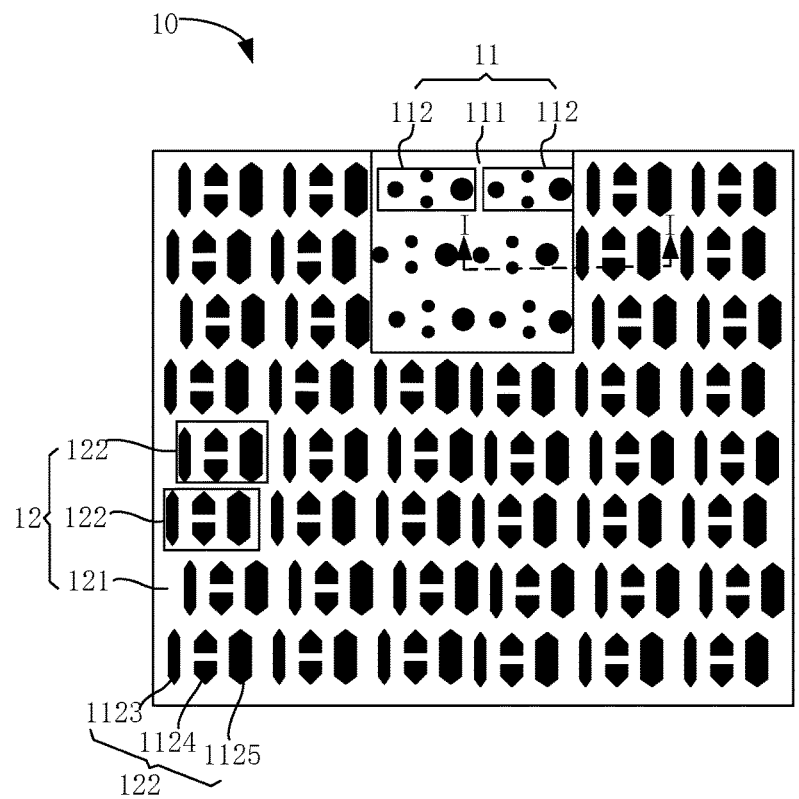
FIG. 1 is a schematic plan view of a display panel according to an embodiment of the present disclosure.

Electronic device 100; Display panel 10; First display region 11; First substrate 111; First pixel unit 112; First pixel defining layer 1121; First pixel anode 1122; First sub-pixel 1123; Second sub-pixel 1124; Third sub-pixel 1125; Second display region 12; Second substrate 121; Second pixel unit 122; Second pixel defining layer 1221; Second pixel anode 1222; and Sensor 20.

DETAIL DESCRIPTION OF EMBODIMENTS

Embodiments of the present disclosure will be described in detail below, and examples of the embodiments are illustrated in the accompanying drawings, where same or similar reference characters refer to the same or similar elements or elements having the same or similar functions throughout the description. The embodiments described below with reference to the accompanying drawings are exemplary only for explaining the present disclosure and are not to be construed as limiting the present disclosure.

In the description of the present disclosure, it should be understood that the terms "central," "longitudinal," "transverse," "length," "width," "thickness," "up," "down," "front," "rear," "left," "right," "vertical," "horizontal," "top," "bottom," "inner," "outer," "clockwise," "counterclockwise," and the like indicate the orientations and positional relationships in the drawings for convenience in describing the present disclosure and to simplify the description only, but are not intended to indicate or imply that the device or element so referred to must have a particular orientation, be constructed and operated in a particular orientation, and are not to be construed as limiting the present disclosure. Furthermore, the terms "first" and "second" are used for descriptive purposes only and should not to be construed as indicating or implying relative importance or implicitly indicating the number of technical features indicated. Thus, a feature defined by the term "first" or "second" may explicitly or implicitly include one or more features. In the description of the present disclosure, the term "a plurality of" means two or more unless specifically limited otherwise.

It should be noted that unless explicitly stated or limited otherwise, the terms "mounted," "coupled" and "connected" in the description of the present disclosure should be construed broadly and may for example be fixedly connected, detachably connected or integrally connected; may be mechanically or electrically connected or may be in communication with each other; may be directly connected or indirectly connected through intervening media, or may be an internal connection between two elements or may be an interaction between two elements. The specific meanings of the above terms in the present disclosure may be understood in a specific case to one of ordinary skill in the art.

The following disclosure provides many different embodiments or examples for implementing different structures of the present disclosure. To simplify the present disclosure, components and arrangements in specific examples are described below. Alternatively, they are merely examples and are not intended to limit the present disclosure. Further, reference numerals and/or reference letters may be repeated in the various examples in the present disclosure for simplicity and clarity and do not in itself dictate a relationship between the various embodiments and/or arrangements discussed. In addition, the present disclosure provides examples of various specific processes and materials, but one of ordinary skill in the art may recognize the application of other processes and/or the use of other materials.

At present, in the camera-under-screen technology, a camera module is located under a screen, and the external light needs to pass through the screen to reach the camera module so that the camera module forms an image. Wires are regularly arranged on the screen and pixel units are periodically arranged on the screen, so that a diffraction phenomenon is caused by the wires and the pixel units arranged on the screen when light passes through the screen and reaches the camera module, and thus, the imaging quality of the camera module is poor. In the related art, a resolution of a screen region corresponding to the camera module may be reduced, that is, the number of the pixel units in the screen region corresponding to the camera module may be reduced, to increase a transmittance of the screen, which alleviates the diffraction phenomenon generated when light passes through the screen from outside, and improves the shooing quality. However, the reduction of the resolution of the screen region corresponding to the camera module affects the visual experience of the user.

Figure 2:
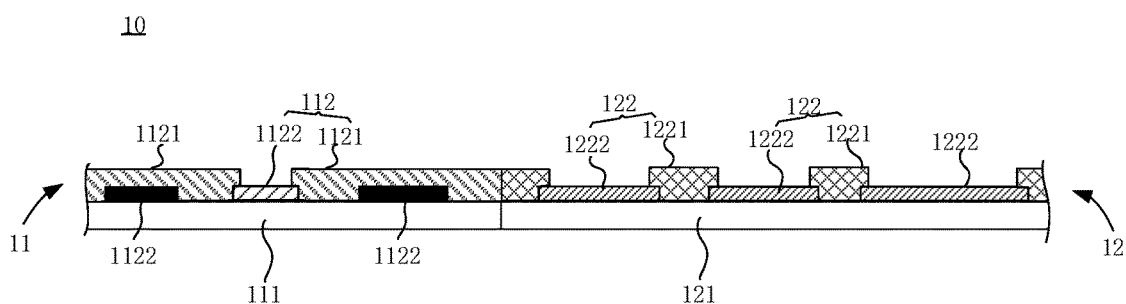
FIG. 2 is a schematic cross-sectional view of a display panel along a line I-I in FIG. 1.

In view of the above, referring to FIG. 1 and FIG. 2, the present disclosure provides a display panel 10, including a first display region 11 and a second display region 12, and a pixel density of the first display region 11 is the same as a pixel density of the second display region 12. The first display region 11 includes a first pixel unit 112, which includes a first pixel defining layer 1121 and a first pixel anode 1122 disposed corresponding to the first pixel defining layer 1121; the second display region 12 includes a second pixel unit 122, which includes a second pixel defining layer 1221 and a second pixel anode 1222 disposed corresponding to the second pixel defining layer 1221.

An opening area of the first pixel defining layer 1121 is smaller than that of the second pixel defining layer 1221 and an exposed area of the first pixel anode 1122 is smaller than that of the second pixel anode 1222.

In the display panel 10 of the present disclosure, the opening area of the first pixel defining layer 1121 of the first pixel unit 112 is smaller than that of the second pixel defining layer 1221 of the second pixel unit 122, and the exposed area of the first pixel anode 1122 of the first pixel unit 112 is smaller than the exposed area of the second pixel anode 1222 of the second pixel unit 122, so that the light transmittance in the first display region 11 is greater than that in the second display region 12, and thus, the diffraction phenomenon occurring when light passes through the first display region 11 from the outside can be reduced, and the imaging effect of the camera module disposed under the first display region 11 can be improved. Besides, the problem can be avoided that the reduction of the resolution of the screen region corresponding to the camera module affects the visual experience of the user.

The display panel 10 may be an organic light-emitting diode (OLED) display panel 10. The display panel 10 uses organic light-emitting diodes for display, which can realize autonomous light emission and customized driving for pixels, and can realize a display function without a backlight, and has the advantages of lightness, thinness, low energy consumption, high brightness, good luminous efficiency and the like.

With further reference to FIG. 2, specifically, the first display region 11 includes a first substrate 111 and the first pixel unit 112. The first pixel unit 112 is integrated on the first substrate 111. Each first pixel unit 112 includes the first pixel defining layer 1121 and the first pixel anode 1122. The first pixel anode 1122 is disposed on the first substrate 111, the first pixel defining layer 1121 is located on a corresponding first pixel anode 1122 and is opposite to the corresponding first pixel anode 1122; and the first pixel defining layer 1121 is configured to define a light-emitting region of a corresponding first pixel unit 112 on a corresponding first pixel anode 1122. The first pixel defining layer 1121 is formed with an opening, and the first pixel anode 1122 is partially exposed through an opening of the corresponding first pixel defining layer 1121. The opening area of the first pixel defining layer 1121 is equal to the exposed area of the first pixel anode 1122.

The second display region 12 includes a second substrate 121 and the second pixel unit 122. The first substrate 111 and the second substrate 121 have a one-piece structure. The first substrate 111 and the second substrate 121 may be flexible substrates, so that the display panel 10 may be manufactured into the flexible display panel 10. Alternatively, the first substrate 111 and the second substrate 121 may be made of a material having a good light transmittance, so as to improve the light transmittance of the display panel 10 or other display properties.

The second pixel unit 122 is integrated on the second substrate 121. The second pixel unit 122 includes the second pixel defining layer 1221 and the second pixel anode 1222. The second pixel anode 1222 is disposed on the second substrate 121, the second pixel defining layer 1221 is disposed on a corresponding second pixel anode 1222 and opposite to the corresponding second anode pixel, and the second pixel defining layer 1221 is configured to define a light-emitting region of a corresponding second pixel unit 122 on the corresponding second pixel anode 1222. The second pixel defining layer 1221 is formed with an opening, and the second pixel anode 1222 is partially exposed through an opening of the corresponding second pixel defining layer 1221. The opening area of the second pixel defining layer 1221 is equal to the exposed area of the second pixel anode 1222.

It should be noted that in the embodiment shown in FIG. 2, a section line I-I in FIG. 1 passes through one first pixel anode 1122 of the first pixel unit 112 in the first display region 11 and three second pixel anodes 1222 of the second pixel units 122 in the second display region 12 shown by the hatching portion in FIG. 2, and does not pass through two first pixel anodes 1122 of the first display region 11 as shown by the black filling portion in FIG. 2.

Further, the opening area of the first pixel defining layer 1121 is smaller than that of the second pixel defining layer 1221 and the exposed area of the first pixel anode 1122 is smaller than that of the second pixel anode 1222. The opening area of the first pixel defining layer 1121 may be ½, ⅓, ⅔, ¾, or ⅗, etc. of the opening area of the second pixel defining layer 1221, and the exposed area of the first pixel anode 1122 may be ½, ⅓, ⅔, ¾, or ⅗, etc. of the exposed area of the second pixel anode 1222. Specific numerical values of the opening area of the first pixel defining layer 1121 and the exposed area of the first pixel anode 1122 are not provided.

For example, in some embodiments, the opening area of the first pixel defining layer 1121 is ½ of the opening area of the second pixel defining layer 1221 and the exposed area of the first pixel anode 1122 is ½ of the exposed area of the second pixel anode 1222, so that an area of the first pixel unit 112 is ½ of that of the second pixel unit 122. In this way, the light transmittance of the first display region 11 is better, and the first display region 11 can be ensured to display normally.

It can be understood that the transmittance of the display panel 10 may be changed due to the design of the pixel units, and thus the light passing through the display panel 10 may be affected. It should be noted that the transmittance is an index for evaluating a light transmission capability of a medium (e.g., the first display region 11 and the second display region 12 in the present disclosure). The main factors affecting the transmittance of the display panel 10 in the pixel units include the exposed area of the pixel anode and the opening area of the pixel defining layer. If the exposed area of the pixel anode and the opening area of the pixel defining layer are changed, the transmittance of the corresponding region of the display panel 10 is changed accordingly. Therefore, the opening area of the first pixel defining layer 1121 is smaller than the opening area of the second pixel defining layer 1221 and the exposed area of the first pixel anode 1122 is smaller than the exposed area of the second pixel anode 1222, so that the transmittance of the first display region 11 is greater than the transmittance of the second display region 12. In this way, the diffraction phenomenon formed when the light passes through the first display region 11 is weaker than the diffraction phenomenon formed when the light passes through the second display region 12.

In some embodiments, the first display region 11 include a plurality of first pixel units 112 distributed in an array, and a plurality of second pixel units 122 distributed in an array, and a distance between any two adjacent first pixel units 112 is greater than a distance between any two adjacent second pixel units 122. It should be noted that a distance between any two adjacent pixel units refers to the minimum edge-to-edge distance between the pixel units.

Figure 3:
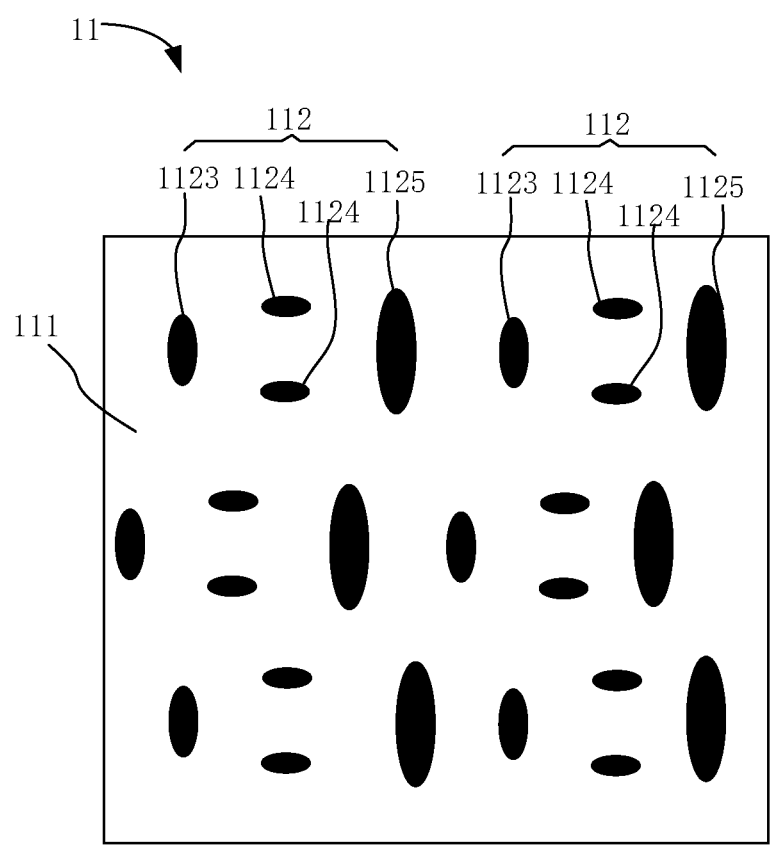
FIG. 3 is a schematic plan view of a first display region according to an embodiment of the present disclosure.

With reference to FIG. 2 and FIG. 3, specifically, each of the first pixel unit 112 and the second pixel unit 122 includes at least one first sub-pixel 1123, at least one second sub-pixel 1124 and at least one third sub-pixel 1125; the first sub-pixel 1123, the second sub-pixel 1124 and the third sub-pixel 1125 of each first pixel unit 112 are distributed at intervals; the first sub-pixel 1123, the second sub-pixel 1124 and the third sub-pixel 1125 of each second pixel unit 122 are distributed at intervals; an area of the first sub-pixel 1123 is greater than an area of the second sub-pixel 1124, and an area of each third sub-pixel 1125 is smaller than an area of the third sub-pixel 1125. For example, in the present disclosure, each of the first pixel unit 112 and the second pixel unit 122 includes one first sub-pixel 1123, two second sub-pixels 1124, and one third sub-pixel 1125.

Further, each first sub-pixel 1123 includes a red sub-pixel, each second sub-pixel 1124 includes a green sub-pixel, and each third sub-pixel 1125 includes a blue sub-pixel.

In some embodiments, each of the first sub-pixel 1123, the second sub-pixel 1124 and the third sub-pixel 1125 of the first pixel unit 112 include one first pixel anode 1122 and one first pixel defining layer 1121; and each of the first sub-pixel 1123, the second sub-pixel 1124 and the third sub-pixel 1125 of the second pixel unit 122 include one second pixel anode 1222 and one second pixel defining layer 1221.

It should be noted that the first pixel anodes 1122 in the first pixel units 112 may have the same shape or some of the first pixel anodes 1122 in the first pixel units 112 may have different shapes, and a shape of the first pixel anode 1122 may be circular, oval, or other regular or irregular shapes, which is not limited here. For example, referring to FIG. 1, in some embodiments, the first pixel anodes 1122 in the first pixel units 112 are all circular. For another example, referring to FIG. 3, in some embodiments, the first pixel anodes 1122 in the first pixel units 112 are all oval, wherein an orientation of a major axis of the first pixel anode 1122 of each of the first sub-pixel 1123 and the third sub-pixel 1125 in the first pixel unit 112 intersects an orientation of a major axis of the first pixel anode 1122 of the second sub-pixel 1124. For another example, referring to FIG. 4, in some embodiments, the first pixel anodes 1122 of the first sub-pixel 1123 and the third sub-pixel 1125 in each first pixel unit 112 are oval and have the major axes in a same orientation, and the first pixel anode 1122 of the second sub-pixel 1124 is circular.

In some embodiments, the exposed area of the first pixel anode 1122 corresponding to the first sub-pixel 1123 in the first pixel unit 112 is smaller than the exposed area of the second pixel anode 1222 corresponding to the first sub-pixel 1123 in the second pixel unit 122, and the opening area of the first pixel defining layer 1121 corresponding to the first sub-pixel 1123 in the first pixel unit 112 is smaller than the opening area of the second pixel defining layer 1221 corresponding to the first sub-pixel 1123 in the second pixel unit 122. The exposed area of the first pixel anode 1122 corresponding to the second sub-pixel 1124 in the first pixel unit 112 is smaller than the exposed area of the second pixel anode 1222 corresponding to the second sub-pixel 1124 in the second pixel unit 122, and the opening area of the first pixel defining layer 1121 corresponding to the second sub-pixel 1124 in the first pixel unit 112 is smaller than the opening area of the second pixel defining layer 1221 corresponding to the second sub-pixel 1124 in the second pixel unit 122. The exposed area of the first pixel anode 1122 corresponding to the third sub-pixel 1125 in the first pixel unit 112 is smaller than the exposed area of the second pixel anode 1222 corresponding to the third sub-pixel 1125 in the second pixel unit 122, and the opening area of the first pixel defining layer 1121 corresponding to the third sub-pixel 1125 in the first pixel unit 112 is smaller than the opening area of the second pixel defining layer 1221 corresponding to the third sub-pixel 1125 in the second pixel unit 122.

For example, in some embodiments, the exposed area of the first pixel anode 1122 corresponding to the first sub-pixel 1123 in the first pixel unit 112 may be ½ of the exposed area of the second pixel anode 1222 corresponding to the first sub-pixel 1123 in the second pixel unit 122, and the opening area of the first pixel defining layer 1121 corresponding to the first sub-pixel 1123 in the first pixel unit 112 may be ½ of the opening area of the second pixel defining layer 1221 corresponding to the first sub-pixel 1123 in the second pixel unit 122. The exposed area of the first pixel anode 1122 corresponding to the second sub-pixel 1124 in the first pixel unit 112 is ½ of the exposed area of the second pixel anode 1222 corresponding to the second sub-pixel 1124 in the second pixel unit 122, and the opening area of the first pixel defining layer 1121 corresponding to the second sub-pixel 1124 in the first pixel unit 112 is ½ of the opening area of the second pixel defining layer 1221 corresponding to the second sub-pixel 1124 in the second pixel unit 122. The exposed area of the first pixel anode 1122 corresponding to the third sub-pixel 1125 in the first pixel unit 112 may be ½ of the exposed area of the second pixel anode 1222 corresponding to the third sub-pixel 1125 in the second pixel unit 122, and the opening area of the first pixel defining layer 1121 corresponding to the third sub-pixel 1125 in the first pixel unit 112 may be ½ of the opening area of the second pixel defining layer 1221 corresponding to the third sub-pixel 1125 in the second pixel unit 122.

In some embodiments, the first display region 11 further includes transparent conductive wires (not shown). Specifically, the conductive wires may be indium tin oxide (ITO), which is a transparent N-type oxide semiconductor. Therefore, the light transmittance performance of the first display region 11 can be further improved by providing the transparent conductive wires in the first display region 11.

Figure 5:
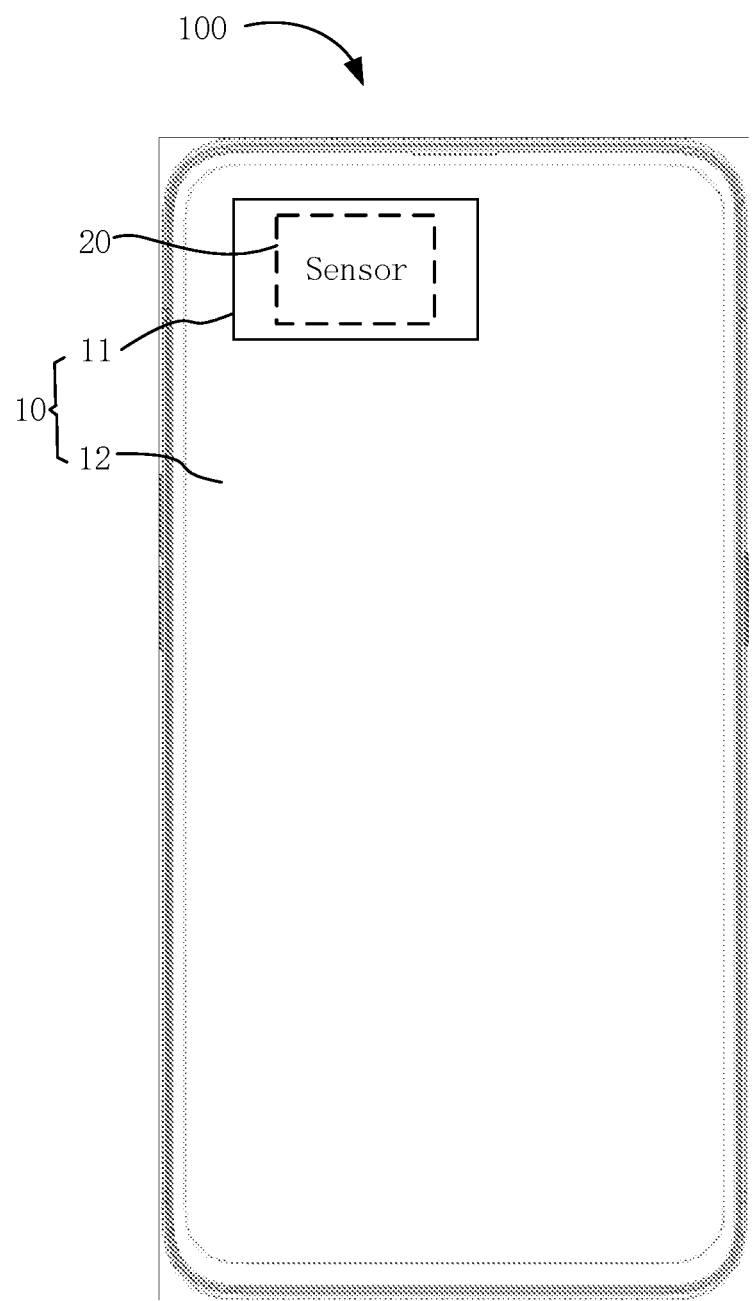
FIG. 5 is a schematic plan view of an electronic device according to an embodiment of the present disclosure.

Referring to FIG. 1, FIG. 2, and FIG. 5, the present disclosure further provides an electronic device 100, including the display panel 10 according to any of the embodiments.

In the electronic device 100 of the present disclosure, the opening area of the first pixel defining layer 1121 of the first pixel unit 112 is smaller than the opening area of the second pixel defining layer 1221 of the second pixel unit 122, and the exposed area of the first pixel anode 1122 of the first pixel unit 112 is smaller than the exposed area of the second pixel anode 1222 of the second pixel unit 122, so that the light transmittance of the first display region 11 is greater than that of the second display region 12. In this way, the diffraction phenomenon occurring when light passes through the first display region 11 from the outside can be alleviated, and the imaging effect of a sensor 20 disposed under the first display region 11 can be improved. Besides, the problem can be avoided that the reduction of the resolution of the screen region corresponding to the sensor 20 affects the visual experience of the user.

Figure 4:
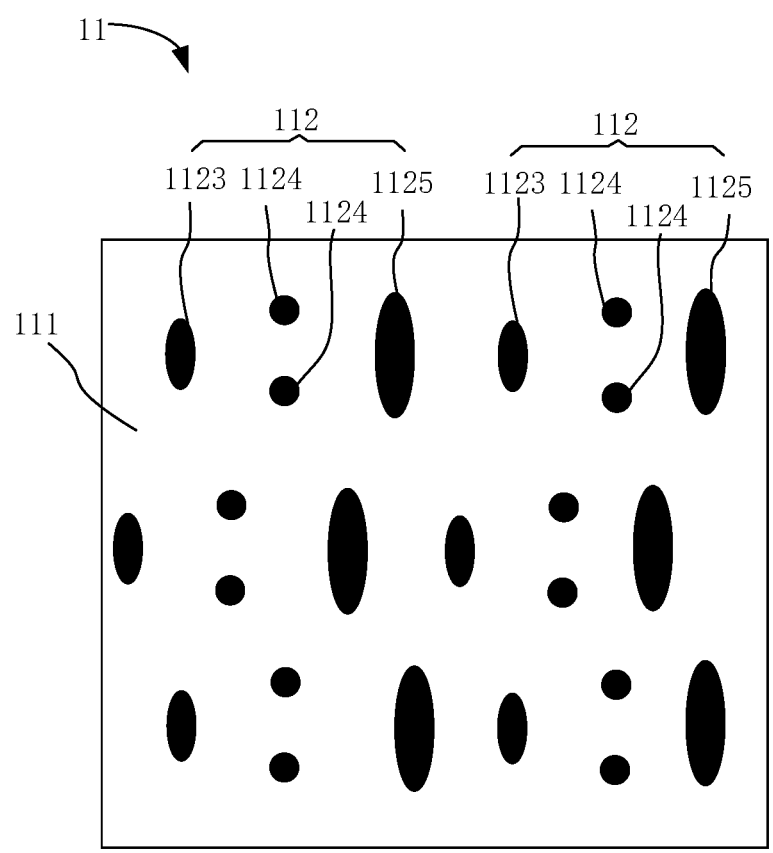
FIG. 4 is another schematic plan view of a first display region according to an embodiment of the present disclosure.

For example, the electronic device 100 may be any of various types of computer system devices that is mobile or portable and can perform wireless communications (only one type is shown in FIG. 4 by way of example). Specifically, the electronic device 100 may be a mobile phone or a smart phone (e.g., a phone based on iPhone™, a phone based on Android™), a portable game device (e.g., Nintendo DS™, PlayStation Portable™, Gameboy Advance™, iPhone™), a tablet computer, a portable internet device, a data storage device, etc. Alternatively, the electronic device 100 may be other wearable devices (e.g., a smart band, a smart watch, AR glasses, VR glasses, etc.).

In some cases, the electronic device 100 may perform a variety of functions (e.g., playing music, displaying videos, storing pictures, and receiving and sending phone calls). Alternatively, the electronic device 100 may be a portable device such as a cellular telephone, a media player, other handheld device, a wrist watch device, an earpiece device, or other compact portable device.

In some embodiments, the electronic device 100 further includes a sensor 20 disposed directly opposite to the first display region 11 of the display panel 10.

Specifically, the sensor 20 can be a camera module, a fingerprint recognition module, an infrared sensor, etc., and the specific type of the sensor 20 is not limited. For example, in the present disclosure, the sensor 20 may be the camera module; the electronic device 100 may make a video recording by using the sensor 20; the sensor 20 is a front-facing sensor 20 of the electronic device 100, which is provided on a backlight side of the first display region 11. In this way, during the sensor 20 operates, the external light may pass through the first display region 11 and enter the sensor 20, so that the sensor 20 can generate a display image after obtaining the external light, and the glare phenomenon and diffraction phenomenon in the display image can be improved, and thus, the user experience is improved.

In the description of this specification, the description with reference to the term "one embodiment", "some embodiments", "illustrative embodiment", "an example", "a specific example" or "some examples" or the like means that a specific feature, structure, material, or characteristic described in connection with the embodiment or example is included in at least one embodiment or example of the present disclosure. In this specification, schematic representations of the above terms do not necessarily refer to the same embodiment or example. Furthermore, the specific feature, structure, material, or characteristic described may be combined in a suitable manner in any one or more embodiments or examples.

While the embodiment of the present disclosure has been shown and described, it will be understood by one of ordinary skill in the art that numerous changes, modifications, substitutions and variations may be made to the embodiment without departing from the principle and spirit of the present disclosure, the scope of the present disclosure is defined by the claims and their equivalents.

What is claimed is:

1. A display panel, comprising a first display region and a second display region,
   wherein a pixel density of the first display region is the same as a pixel density of the second display region;
   the first display region comprises a first pixel unit, which comprises a first pixel defining layer and a first pixel anode corresponding to the first pixel defining layer;
   the second display region comprises a second pixel unit, which comprises a second pixel defining layer and a second pixel anode corresponding to the second pixel defining layer;
   each of the first pixel unit and the second pixel unit comprises one first sub-pixel, two second sub-pixels and one third sub-pixel, the two second sub-pixels are arranged in a first direction and disposed between the one first sub-pixel and the one third sub-pixel in a second direction crossing the first direction, and the second sub-pixels are separated from the one first sub-pixel and the one third sub-pixel,
   wherein an opening area of the first pixel defining layer is smaller than an opening area of the second pixel defining layer; and
   an exposed area of the first pixel anode is smaller than an exposed area of the second pixel anode.

2. The display panel according to claim 1, wherein the opening area of the first pixel defining layer is ½ of the opening area of the second pixel defining layer; and
   the exposed area of the first pixel anode is ½ of the exposed area of the second pixel anode.

3. The display panel according to claim 2, wherein the first display region comprises a plurality of first pixel units, and the plurality of first pixel units are arranged in an array;
   the second display region comprises a plurality of second pixel units, and the plurality of second pixel units are arranged in an array; and
   a distance between any two adjacent first pixel units is greater than a distance between any two adjacent second pixel units.

4. The display panel according to claim 1, wherein each of the first sub-pixel, the second sub-pixel, and the third sub-pixel of the first pixel unit comprises one first pixel anode and one first pixel defining layer, and
   each of the first sub-pixel, the second sub-pixel, and the third sub-pixel of the second pixel unit comprises one second pixel anode and one second pixel defining layer;
   an exposed area of the first pixel anode corresponding to the first sub-pixel in the first pixel unit is smaller than an exposed area of the second pixel anode corresponding to the first sub-pixel in the second pixel unit, and an opening area of the first pixel defining layer corresponding to the first sub-pixel in the first pixel unit is smaller than an opening area of the second pixel defining layer corresponding to the first sub-pixel in the second pixel unit;
   an exposed area of the first pixel anode corresponding to the second sub-pixel in the first pixel unit is smaller than an exposed area of the second pixel anode corresponding to the second sub-pixel in the second pixel unit, and an opening area of the first pixel defining layer corresponding to the second sub-pixel in the first pixel unit is smaller than an opening area of the second pixel defining layer corresponding to the second sub-pixel in the second pixel unit; and
   an exposed area of the first pixel anode corresponding to the third sub-pixel in the first pixel unit is smaller than an exposed area of the second pixel anode corresponding to the third sub-pixel in the second pixel unit, and an opening area of the first pixel defining layer corresponding to the third sub-pixel in the first pixel unit is smaller than an opening area of the second pixel defining layer corresponding to the third sub-pixel in the second pixel unit.

5. The display panel according to claim 4, wherein the first sub-pixel comprises a red sub-pixel, the second sub-pixel comprises a green sub-pixel, and the third sub-pixel comprises a blue sub-pixel.

6. The display panel according to claim 5, wherein the first pixel anode is circular.

7. The display panel according to claim 5, wherein the first pixel anode is oval; and
   wherein an orientation of a major axis of the first pixel anode of each of the first sub-pixel and the third sub-pixel in the first pixel unit intersects an orientation of a major axis of the first pixel anode of the second sub-pixel.

8. The display panel according to claim 5, wherein the first pixel anode is circular or oval; and
   wherein the first pixel anode of each of the first sub-pixel and the third sub-pixel in the first pixel unit is oval, and the first pixel anode of the second sub-pixel in the first pixel unit is circular.

9. The display panel according to claim 1, further comprising transparent conductive wires in the first display region.

10. An electronic device, comprising a display panel, wherein the display panel is the display panel according to claim 1.

11. The electronic device according to claim 10, further comprising a sensor directly opposite to the first display region of the display panel.

12. The electronic device according to claim 11, wherein the sensor comprises a camera module, a fingerprint recognition module, or an infrared sensor.

13. The electronic device according to claim 10, wherein the opening area of the first pixel defining layer is ½ of the opening area of the second pixel defining layer; and
   the exposed area of the first pixel anode is ½ of the exposed area of the second pixel anode.

14. The electronic device according to claim 13, wherein the first display region comprises a plurality of first pixel units, and the plurality of first pixel units are arranged in an array;
   the second display region comprises a plurality of second pixel units, and the plurality of second pixel units are arranged in an array; and
   a distance between any two adjacent first pixel units is greater than a distance between any two adjacent second pixel units.

15. The electronic device according to claim 10, wherein each of the first sub-pixel, the second sub-pixel, and the third sub-pixel of the first pixel unit comprises one first pixel anode and one first pixel defining layer, and
   each of the first sub-pixel, the second sub-pixel, and the third sub-pixel of the second pixel unit comprises one second pixel anode and one second pixel defining layer;
   an exposed area of the first pixel anode corresponding to the first sub-pixel in the first pixel unit is smaller than an exposed area of the second pixel anode corresponding to the first sub-pixel in the second pixel unit, and an opening area of the first pixel defining layer corresponding to the first sub-pixel in the first pixel unit is smaller than an opening area of the second pixel defining layer corresponding to the first sub-pixel in the second pixel unit;
   an exposed area of the first pixel anode corresponding to the second sub-pixel in the first pixel unit is smaller than an exposed area of the second pixel anode corresponding to the second sub-pixel in the second pixel unit, and an opening area of the first pixel defining layer corresponding to the second sub-pixel in the first pixel unit is smaller than an opening area of the second pixel defining layer corresponding to the second sub-pixel in the second pixel unit; and
   an exposed area of the first pixel anode corresponding to the third sub-pixel in the first pixel unit is smaller than an exposed area of the second pixel anode corresponding to the third sub-pixel in the second pixel unit, and an opening area of the first pixel defining layer corresponding to the third sub-pixel in the first pixel unit is smaller than an opening area of the second pixel defining layer corresponding to the third sub-pixel in the second pixel unit.

16. The electronic device according to claim 15, wherein the first sub-pixel comprises a red sub-pixel, the second sub-pixel comprises a green sub-pixel, and the third sub-pixel comprises a blue sub-pixel.

17. The electronic device according to claim 16, wherein the first pixel anode is circular.

18. The electronic device according to claim 16, wherein the first pixel anode is oval; and
   wherein an orientation of a major axis of the first pixel anode of each of the first sub-pixel and the third sub-pixel in the first pixel unit intersects an orientation of a major axis of the first pixel anode of the second sub-pixel.

* * * * *